United States Patent
Yu et al.

(10) Patent No.: US 11,682,660 B2
(45) Date of Patent: Jun. 20, 2023

(54) SEMICONDUCTOR STRUCTURE

(71) Applicant: Advanced Semiconductor Engineering, Inc., Kaohsiung (TW)

(72) Inventors: Yuanhao Yu, Kaohsiung (TW); Chun Chen Chen, Kaohsiung (TW); Shang Chien Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 307 days.

(21) Appl. No.: 17/076,480

(22) Filed: Oct. 21, 2020

(65) Prior Publication Data

US 2022/0122950 A1  Apr. 21, 2022

(51) Int. Cl.
*H01L 25/10* (2006.01)
*H01L 25/18* (2023.01)
*G06F 3/0354* (2013.01)

(52) U.S. Cl.
CPC ............ *H01L 25/105* (2013.01); *H01L 25/18* (2013.01); *G06F 3/03545* (2013.01); *H01L 2225/107* (2013.01); *H01L 2225/1058* (2013.01); *H01L 2225/1076* (2013.01)

(58) Field of Classification Search
CPC ............ H05K 1/02; H05K 1/09; H05K 7/023; H05K 7/20254; H05K 1/14; H05K 1/141–147; H01L 23/13; H01L 23/31; H01L 23/3128; H01L 23/525; H01L 23/538; H01L 23/3114; H01L 23/5385–5387; H01L 25/10; H01L 25/18; H01L 25/105

USPC ............ 361/767–795; 257/660–690
See application file for complete search history.

(56) References Cited

U.S. PATENT DOCUMENTS

| | | | | |
|---|---|---|---|---|
| 5,016,138 A | * | 5/1991 | Woodman ......... | H05K 7/20254 361/698 |
| 5,397,916 A | * | 3/1995 | Normington ....... | H01L 23/5387 257/692 |
| 2005/0130345 A1 | * | 6/2005 | Jeung ............... | H01L 25/105 438/106 |
| 2015/0014860 A1 | * | 1/2015 | Jang ................ | H01L 24/05 257/774 |
| 2015/0222364 A1 | * | 8/2015 | Hwang ............. | H01L 24/00 398/138 |
| 2016/0188008 A1 | * | 6/2016 | Horie ............... | G01D 5/2046 345/179 |
| 2019/0273065 A1 | * | 9/2019 | Yu ................... | H01L 25/18 |

FOREIGN PATENT DOCUMENTS

TW    201238012 A1    9/2012

* cited by examiner

*Primary Examiner* — Tuan T Dinh
(74) *Attorney, Agent, or Firm* — Foley & Lardner LLP (57) ABSTRACT

The present disclosure provides a semiconductor structure including a first substrate having a first surface, a first semiconductor device package disposed on the first surface of the first substrate, and a second semiconductor device package disposed on the first surface of the first substrate. The first semiconductor device package and the second semiconductor device package have a first signal transmission path through the first substrate and a second signal transmission path insulated from the first substrate. The present disclosure also provides an electronic device.

6 Claims, 11 Drawing Sheets

FIG. 4B

SEMICONDUCTOR STRUCTURE

BACKGROUND

1. Technical Field

The present disclosure generally relates to a semiconductor structure and an electronic device.

2. Description of the Related Art

In existing electronic devices, a plurality of semiconductor device packages may be connected to a substrate by, for example, surface mount techniques (SMT). The signal transmission between the semiconductor device packages can be achieved through the substrate.

However, due to the limitation of the size and shape of the electronic devices, it is difficult to have more semiconductor device packages within the electronic devices. In addition, the signal transmission path between the semiconductor device packages through the substrate may cause conduction loss, which would adversely affect the performance of the electronic devices.

SUMMARY

In some embodiments, a semiconductor structure includes a first substrate having a first surface, a first semiconductor device package disposed on the first surface of the first substrate, and a second semiconductor device package disposed on the first surface of the first substrate. The semiconductor structure also includes a first transmission path electrically connecting the first semiconductor device package and second semiconductor device package through the first substrate, and a second transmission path electrically connecting the first semiconductor device package and second semiconductor device package. The second transmission path is outside the first substrate.

In some embodiments, a semiconductor structure includes a first semiconductor device package and a second semiconductor device package stacked on the first semiconductor device package. The semiconductor structure also includes a first interconnection electrically connecting the first semiconductor device package and the second semiconductor device package, and a second interconnection electrically connecting the first semiconductor device package and the second semiconductor device package. The first interconnection is different from the second interconnection in electrical property.

In some embodiments, an electronic device includes a first semiconductor device package, and a second semiconductor device package stacked on the first semiconductor device package. The electronic device also includes a case defining a space accommodating the first semiconductor device package and the second semiconductor device package. The space defined by the case has a first dimension and a second dimension longer than the first dimension. The first semiconductor device package and the second semiconductor device package are stacked in a direction parallel to the second dimension.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1:
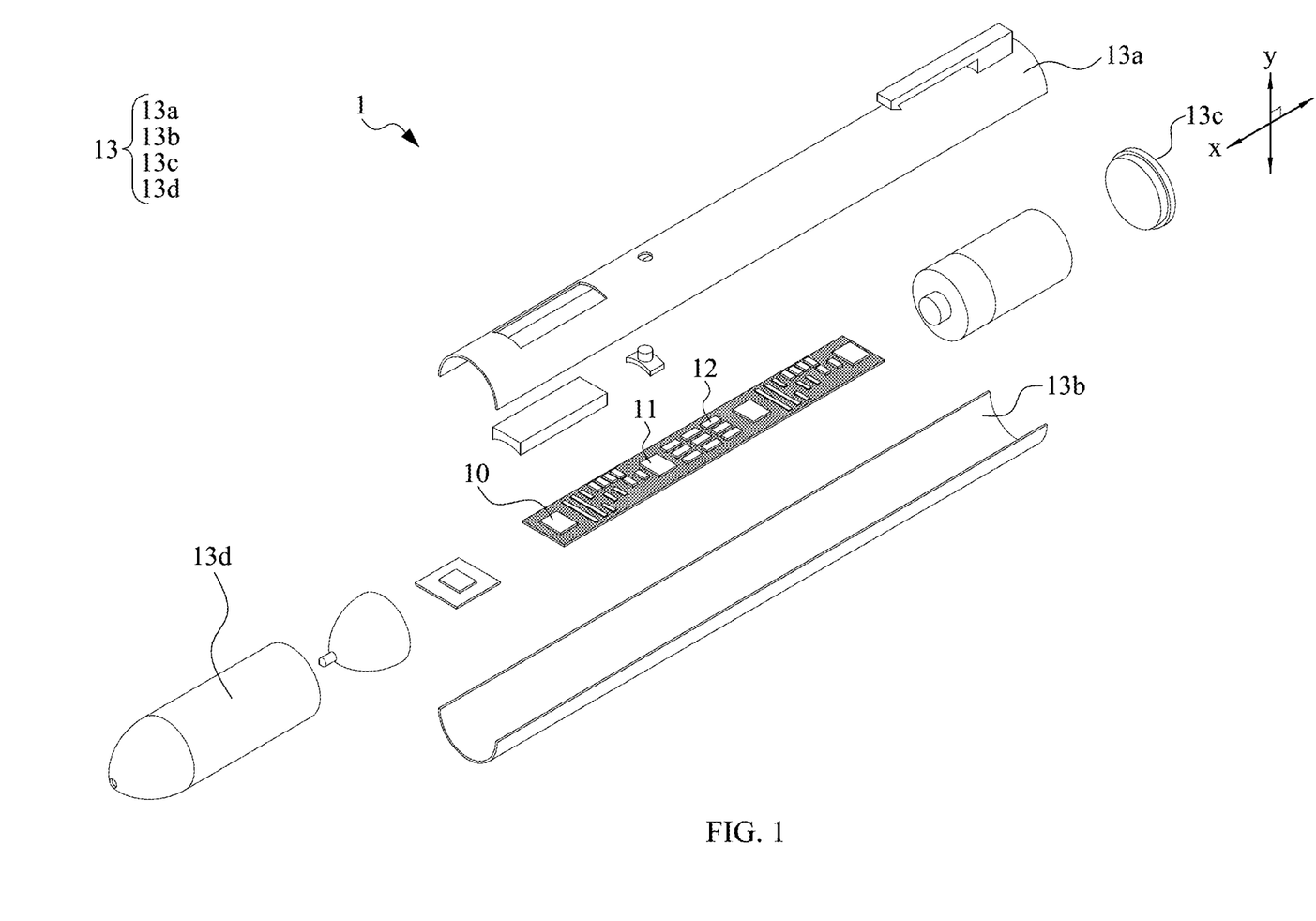
FIG. 1 illustrates an exploded view of an example electronic device.

FIG. 1 illustrates an exploded view of an example electronic device 1. In some arrangements, the electronic device 1 includes a substrate 10, electronic components 11, 12, and a case 13.

The case 13 is a housing or a cover of the electronic device 1. In the examples in which the electronic device 1 is a digital writing device, the case 13 is a pen tube as shown. The case 13 is includes multiple portions, including case parts 13a, 13b, 13c, and 13d as shown. The case parts 13a, 13b, 13c, and 13d together define an interior space or volume having a length along an x-axis and a width along or parallel to an y-axis substantially perpendicular to the x-axis. The total length of the space is greater than the total width of the space. In some examples, the space has cylindrical shape, as shown in FIG. 1. In some examples, as shown in FIG. 1, the cylindrical shape has a height that is greater than a diameter of the cylindrical shape. The space defined by the case 13 houses and contains therein various components of the electronic device, including the substrate 10 (including the electronic components 11 and 12), as well as other components such as a power supply, portions of one or more actuators (e.g., buttons), other electronic components, and so on.

The substrate 10 may include, for example, one or more of a printed circuit board, such as a paper-based copper foil laminate, a composite copper foil laminate, a polymer-impregnated glass-fiber-based copper foil laminate, or so on. The substrate 10 may include an interconnection structure, such as a redistribution layer (RDL) or a grounding element. In some examples, the substrate 10 may be rectangular. As shown in FIG. 1, the substrate 10 may have a side or edge along or parallel to the x-axis that is longer than another side (e.g., an adjacent side) along or parallel to the y-axis. In other examples, the substrate 10 may have another shape suitable to be fitted within the space defined by the case 13.

In some examples, each of the electronic components 11 and 12 may be a chip or a die including a semiconductor substrate, one or more integrated circuit (IC) devices, and one or more overlying interconnection structures therein. In some examples, the IC devices may include an active component, such as an IC chip or a die. In some examples, the integrated circuit devices may include a passive electronic component, such as a capacitor, a resistor, or an inductor.

The electronic components 11 and 12 are disposed or installed on the substrate 10. In some examples, the electronic components 11 and 12 may be disposed on the substrate 10 by, for example, surface mounting techniques (SMT) or another suitable mechanism for mounting electronic components on a substrate. The electronic components 11 and 12 may be electrically connected to the substrate 10 by, for example, flip-chip or wire-bonding. In some examples, the electronic components 11 and 12 are disposed adjacent to one another. For example, the electronic component 11 is disposed in a first position on the substrate 10 that is adjacent to a second position on the substrate 10 on which the electronic component 12 is disposed, where the first and second positions are located along the x-axis. In some examples, a line normal to a flat active surface of each of the electronic component 11 and the electronic component 12 is in a direction along or parallel to the y-axis. In some examples, the signal transmission between the electronic component 11 and the electronic component 12 can be achieved through the substrate 10 (e.g., the interconnection structure of the substrate 10). That is, the electronic signals between the electronic components 11 and 12 are transmitted via the interconnection structures of the substrate 10. Furthermore, the electronic components 11 and 12 are electrically connected to a power supply via the interconnection structures of the substrate 10.

In some examples, to integrate more functions in the electronic device 1, more electronic components (such as but not limited to a, wireless charging module, Bluetooth® module, angular velocity sensing module, etc.) are added into the space defined by the cover 13. However, due to limitations on the size and shape of the space defined by the cover 13, it may be difficult to incorporate a large number of semiconductor device packages within the space. In addition, due to the elongated shape of the space defined by the cover 13, a signal transmission path between an electronic component closer to one end of the space (e.g., adjacent to the part 13c) and another electronic component closer to the opposite end of the space (e.g., adjacent to the part 13d) would be long, thus causing conduction loss, which may adversely affect the performance of the electronic device 1.

Figure 2A:
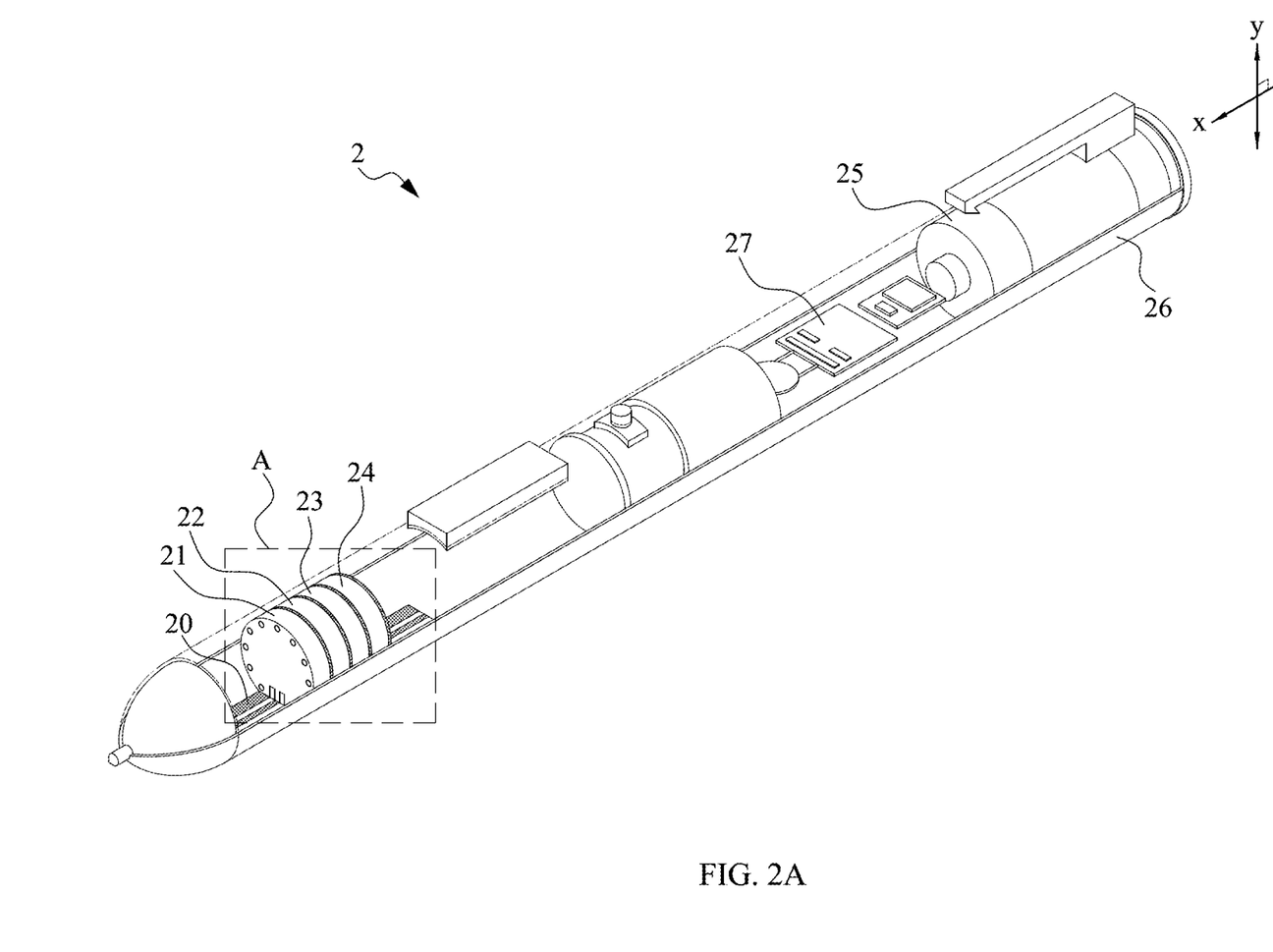
FIG. 2A illustrates a perspective view of an example electronic device in accordance with some embodiments of the present disclosure.
Figure 2B:
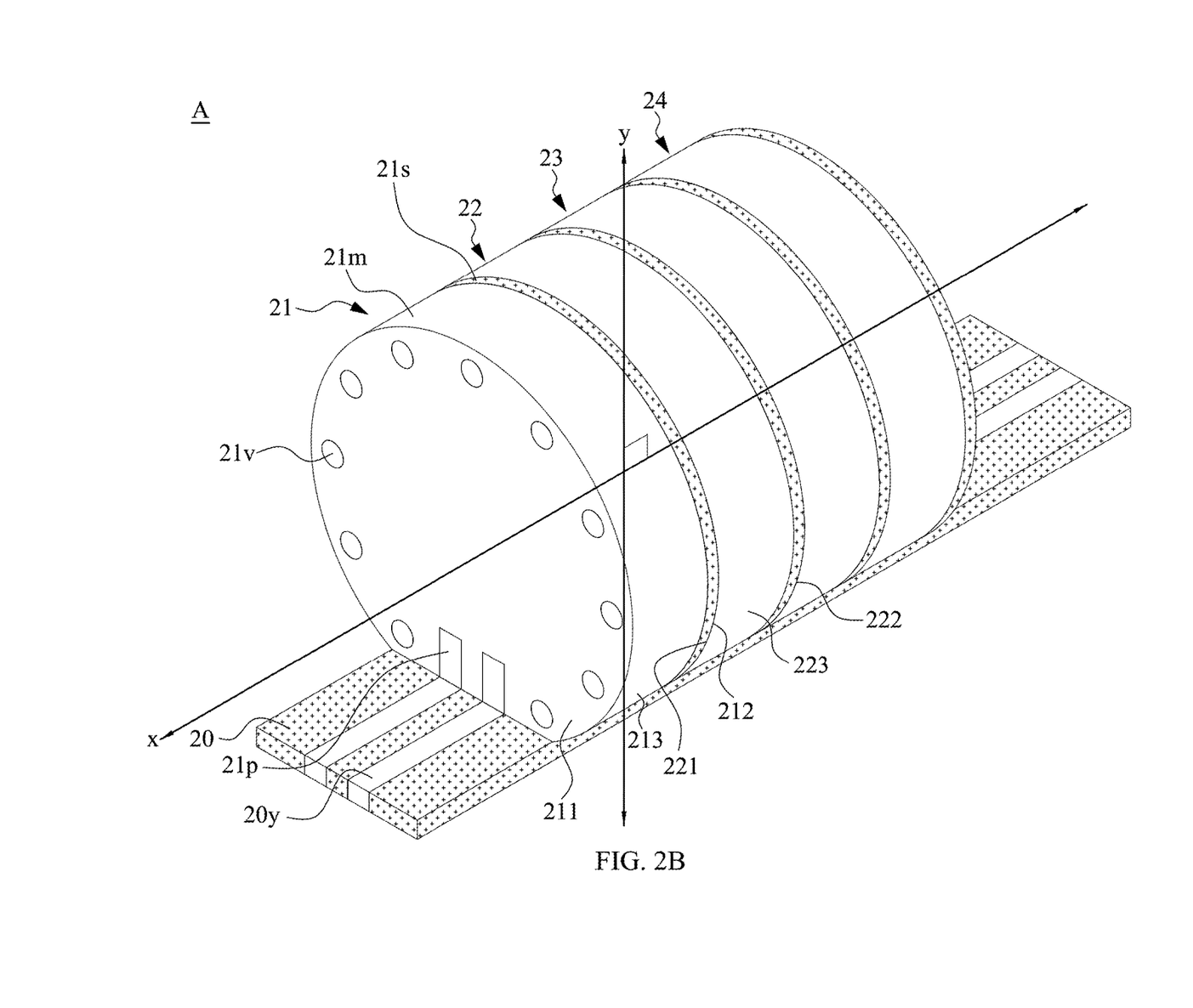
FIG. 2B illustrates a perspective view of an example semiconductor structure as shown in FIG. 2A in accordance with some embodiments of the present disclosure.
Figure 2C:
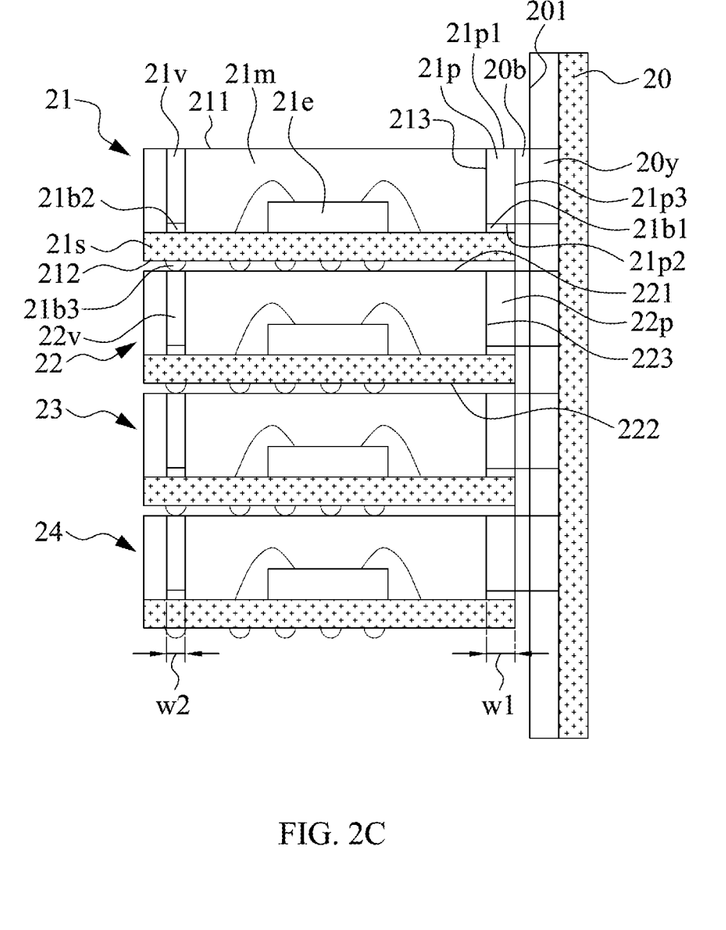
FIG. 2C illustrates a cross-sectional view of the semiconductor structure as shown in FIG. 2B in accordance with some embodiments of the present disclosure.

FIG. 2A illustrates a perspective view of an electronic device 2 in accordance with some embodiments of the present disclosure. FIG. 2B illustrates a perspective view of a portion of the electronic device 2 denoted by dashed box A as shown in FIG. 2A, in accordance with some embodiments of the present disclosure. FIG. 2C illustrates a cross-sectional view of the semiconductor structure shown in FIG. 2B, in accordance with some embodiments of the present disclosure. Examples of the electronic device 1 include a digital pen, a smart pen, and so on. In some examples, the electronic device 1 may be other electronic devices, such as an electronic device for transferring motion of a hand of a user holding the electronic device as detected by the electronic device into digital signals. While the electronic device 1 is shown as a digital writing device (e.g., a digital pen or a smart pen) as shown in FIG. 1, the electronic device 1 is used to illustrate an electronic device having a plurality of semiconductor device packages connected to a substrate and arranged within an elongated space.

The electronic device 2 includes a substrate 20, semiconductor device packages 21, 22, 23, 24, a power supply 25, a case 26, and an electronic component 27.

In some embodiments, the case 26 can be a housing or cover of the electronic device 2 such as but not limited to, the case 13 shown in FIG. 1. In some example, the case 26 may include multiple portions (not shown) such as but not limited to, the parts 13a, 13b, 13c, and 13d. In other examples, the case 26 may include one unitary portion. The case 26 defines an interior space or volume having a length or dimension along the x-axis and a width or another dimension along or parallel to the y-axis substantially perpendicular to the x-axis. The space has an elongated shape, such that the total length of the space is greater than the total width of the space. In some examples, the space has cylindrical shape, as shown in FIG. 2A. In some examples, as shown in FIG. 2A, the cylindrical shape has a height (length) that is greater than a diameter of a circular cross section of the cylindrical shape, the circular cross section being perpendicular to the x-axis. The space may have other suitable elongated shapes having a length (along the x-axis) greater than any width of a cross-section defined by a plane perpendicular to the x-axis. As used herein, length refers to the longer dimension of the case 26, and width or diameter refers to the shorted dimension of the case 26, where the case 26 has a substantially elongated shape. The substrate 20, the semiconductor device packages 21, 22, 23, 24, the power supply 25, and the electronic component 27 are accommodated in the space defined by the case 26.

In some embodiments, the substrate 20 may include, for example, a flexible printed circuit board. In some embodiments, the substrate 20 may be bent or twisted to conform to the shape of the case 26. In some embodiments, the substrate 20 may be bent or twisted to conform to the shape of the semiconductor device packages 21, 22, 23, and 24. For example, the substrate 20 may be bent or twisted to conform to the internal surface of the case 26. For example, the substrate 20 may have a curved surface when bent or twisted, and conformed to the space or the internal surface of the case 26.

As shown in FIG. 2C, the substrate 20 includes one or more interconnection structures (e.g., an RDL). The interconnection structures include, for example, one or more conductive pads (e.g., conductive pads 20y) proximate to, adjacent to, or embedded in and exposed from, a surface 201 of the substrate 20 facing the semiconductor device packages 21, 22, 23 and 24. In particular, a conductive pad 20y is proximate to, adjacent to, or embedded in and exposed from, a surface 201 of the substrate 20 to face each of the semiconductor device packages 21, 22, 23 and 24.

The semiconductor device packages 21, 22, 23, and 24 are stacked in a direction (e.g., along the x-axis) that is substantially parallel to the surface 201 of the substrate 20. Each of the semiconductor device packages 21, 22, 23, and 24 may be electrically connected to the substrate 20 (e.g., to the conductive pads 20y of the substrate 20). In some embodiments, the substrate 20 may provide signal transmission paths among the semiconductor device packages 21, 22, 23, and 24. For example, each of the semiconductor device packages 21, 22, 23 and 24 may electrically connect with the RDL in the substrate 20 through the conductive pad 20y. In some embodiments, the conductive pad 20y may also be referred to as a common contact. The common contact may include a trace or a pad for connecting the semiconductor device packages 21, 22, 23 and 24. In some embodiments, the common contact can be electrically connected with power or may be grounded.

As shown in FIG. 2C, the semiconductor device package 21 has a substrate 21s, an electronic component 21e, one or more conductive elements (which may include a conductive pillar 21p and a conductive via 21v), and a package body 21m. In some embodiments, each of the semiconductor device packages 22, 23, and 24 may include components such as but not limited to, the substrate 21s, electronic component 21e, conductive pillar 21p, conductive via 21v, package body 21m, and other elements described herein, as shown and described with reference to the semiconductor device package 21, and those components are not repeated in the specification or referenced with reference numerals for the sake of brevity and clarity, except conductive via 22v (corresponding to conductive via 21v), conductive pillar 22p (corresponding to conductive pillar 21p), surface 221 (corresponding to surface 2111), surface 222 (corresponding to surface 212), and lateral surface 223 (corresponding to lateral surface 213) of the semiconductor device package 22.

The substrate 21s may have a surface substantially perpendicular to the surface 201 of the substrate 20. The substrate 21s may include, for example, a printed circuit board, such as a paper-based copper foil laminate, a composite copper foil laminate, or a polymer-impregnated glass-fiber-based copper foil laminate. The substrate 21s may include an interconnection structure, such as an RDL or a grounding element.

Figure 2D:
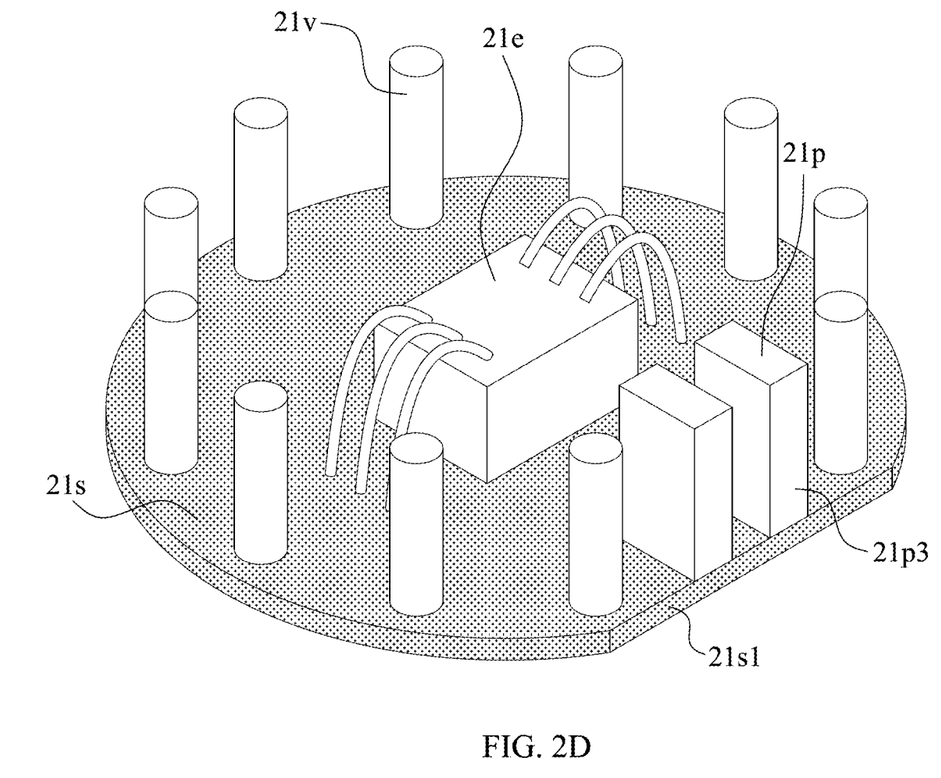
FIG. 2D illustrates a perspective view of a portion of the semiconductor structure as shown in FIG. 2B in accordance with some embodiments of the present disclosure.

The substrate 21s may have any suitable shape. For example, as shown in FIG. 2F, which illustrates a top view of the semiconductor device package 21, the substrate 21s has a circular shape or a substantially circular shape, which may or may not correspond to a cross section of the shape of the space defined by the case 26. In another example, as shown in FIG. 2G, which illustrates a top view of another semiconductor device package (similar to the semiconductor device package 21 except for the shape), the substrate (also denoted using 21s) has a rectangular shape, which may or may not correspond to a cross section of the space defined by the case 26. The substrate may have another shape that corresponds or conforms to a cross section of the space defined by the case 26.

As shown in FIG. 2C, the electronic component 21e is disposed on the surface of the substrate 21s that is substantially perpendicular to the surface 201 of the substrate 20. The electronic component 21e is electrically connected to the substrate 21s by flip-chip or wire-bond techniques. The electronic component 21e may be a chip or a die including a semiconductor substrate, one or more integrated circuit devices, and one or more overlying interconnection structures therein. The integrated circuit devices may include active devices such as transistors and/or passive devices such resistors, capacitors, inductors, or a combination thereof.

In some embodiments, the electronic component 21e may be or include, for example, one or more of a power management IC, a sensing module (e.g., a motion sensor, a pressure sensor, a temperature sensor, an optical sensor, a proximity sensor or the like), a light-emitting diode (LED), a communication module (e.g., a Bluetooth Module®, a Wi-Fi module, a GPS module, a cellular module or the like), a processor, a memory, or so on. In some embodiments, the electronic component 21e may be or include a touch screen or a touch panel, such as a small capacitive touch panel. In some embodiments, the electronic component 21e may include a display or a monitor. In some embodiments, the electronic component 21e may include an alarm, such as an optical warning device or an audible warning device. In some embodiments, while each of the semiconductor device packages 21, 22, 23, and 24 can include an electronic component 21e such as but not limited to the electronic component 21e as described herein, the electronic component 27, which is spaced apart from the substrate 20, can also be one or more types of electronic components mentioned above with respect to the electronic component 21e. In some embodiments, the semiconductor device packages 21, 22, 23, and 24 may include different types of electronic components. In some embodiments, two or more of the semiconductor device packages 21, 22, 23, and 24 may include a same type of electronic components.

The package body 21m is disposed on the substrate 21s. The package body 21m covers or encapsulates the electronic component 21e. The package body 21m covers or encapsulates a portion of the conductive pillar 21p. The package body 21m covers or encapsulates a portion of the conductive via 21v. The package body 21m may include an epoxy resin having fillers, a molding compound (e.g., an epoxy molding compound or other molding compound), a polyimide, a phenolic compound or material, a material with a silicone dispersed therein, or a combination thereof.

The conductive pillar 21p is disposed on the substrate 21s and electrically connected to the substrate 21s through an electrical contact 21b1 (e.g. a solder ball). The conductive pillar 21p is spaced apart from the electronic component 21e. The conductive pillar 21p is disposed adjacent to the substrate 20.

The conductive pillar 21p has a top surface 21p1 exposed from the package body 21m, a bottom surface 21p2 opposite the top surface 21p1, and a lateral surface 21p3 extending between the top surface 21p1 and the bottom surface 21p2. In some embodiments, the top surface 21p1 of the conductive pillar 21p may be substantially coplanar with a top surface of the package body 21m. In some embodiments, the lateral surface 21p3 of the conductive pillar 21p may be substantially coplanar with a lateral surface of the package body 21m. In some embodiments, the lateral surface 21p3 of the conductive pillar 21p may be substantially coplanar with a lateral surface 21s1 of the substrate 21s, for example, as shown in FIG. 2D. In some embodiments, a roughness of the top surface 21p1 of the conductive pillar 21p may be greater than a roughness of the lateral surface 21p3 of the conductive pillar 21p. In an example manufacturing process of the semiconductor device package 21, the conductive pillar 21p may be provided on a substrate and then encapsulated by a package body. Subsequently, the package body and the substrate may be cut (such as by a saw, by using a suitable etchant, by laser, or so on) to expose the lateral surface 21p3 of the conductive pillar 21p. The substrate may be cut to have the lateral surface 21s1 substantially coplanar with the lateral surface 21p3. Afterward, the package body may be grinded (such as through a grinding apparatus or other apparatus) to expose the top surface 21p1 of the conductive pillar 21p. The package body may be grinded to have the top surface substantially coplanar with the top surface 21p1. Since the top surface 21p1 of the conductive pillar 21p is grinded, a roughness of the top surface 21p1 of the conductive pillar 21p may be greater than a roughness of the lateral surface 21p3 of the conductive pillar 21p, which is formed by a cutting operation.

The lateral surface 21p3 of the conductive pillar 21p is exposed from the package body 21m to provide an electrical connection with the substrate 20. For example, the conducive pillar 21p is electrically connected to the substrate 20 (e.g., to the conductive pad 20y of the substrate 20) through an electrical contact 20b (e.g., a solder ball). In some embodiments, the transmission path between the electronic component 21e and the substrate 20 may include first interconnections. The first interconnections include the substrate 21s, the electrical contact 21b1, the conductive pillar 21p, and the electrical contact 20b.

In some embodiments, the conductive pillar 21p may be configured to transmit or receive power. For example, the electronic component 21e may receive power from a power supply power through the substrate 21s, the electrical contact 21b1, the conductive pillar 21p, and the electrical contact 20b. For some embodiments, one of the semiconductor device packages 21, 22, 23, and 24 may include a power supply and may be used to provide power to the other semiconductor device packages through the conductive pillar thereof. For some embodiments, a power supply (e.g., the power supply 25 in FIG. 2A) may be disposed outside of the substrate 20 and may be electrically connected with the substrate 20 through one or more conductive elements, such as a wire. In some embodiments, the conductive pillar 21p may be grounded or be connected to ground. For example, the electronic component 21e may be grounded through the substrate 21s, the electrical contact 21b1, the conductive pillar 21p, and the electrical contact 20b.

The conductive via (or a conductive pin) 21v is disposed on the substrate 21s and electrically connected to the substrate 21s through an electrical contact 21b2 (e.g. a solder ball). The conductive via 21v is spaced apart from the electronic component 21e. In some embodiments, there may be a plurality of conductive vias 21v arranged at or adjacent to the periphery of the substrate 21s, as illustrated in FIGS. 2D, 2F, and 2G. The conductive vias 21v may surround the electronic component 21e. In some embodiments, the semiconductor device package 21 may include any number of conductive vias 21v.

As shown in FIG. 2C, the conductive via 21v has a top surface exposed from the package body 21m, a bottom surface opposite the top surface of the conductive via 21v, and a lateral surface) extending between the top surface of the conductive via 21v and the bottom surface of the conductive via 21v.

In some embodiments, the top surface of the conductive via 21v may be substantially coplanar with the top surface of the package body 21m. In some embodiments, the lateral surface of the conductive via 21v may be covered or encapsulated by the package body 21m. In some embodiments, a roughness of the top surface of the conductive via 21v may be greater than a roughness of the lateral surface of the conductive via 21v. In an example manufacturing process of the semiconductor device package 21, the conductive via 21v may be provided on a substrate and then encapsulated by a package body. Subsequently, the package body and the substrate may be cut (such as by a saw, by using a suitable etchant, by laser, or so on) to expose the lateral surface of the conductive via 21v. Afterward, the package body may be grinded (such as through a grinding apparatus or other apparatus) to expose the top surface of the conductive via 21v. The package body may be grinded to have the top surface substantially coplanar with the top surface of the conductive via 21v. Since the top surface of the conductive via 21v is grinded, a roughness of the top surface of the conductive pillar 21p may be greater than a roughness of the lateral surface of the conductive pillar 21p.

In some embodiments as shown in FIG. 2C, a width (or a diameter) w1 of the conductive pillar 21p may be greater than a width (or a diameter) w2 of the conductive via 21v. In some embodiments, the width w2 of the conductive via 21v may be smaller to improve space-efficiency as long as the conductive via 21v is able to transmit signals between the semiconductor device package 21 and the semiconductor device package 22. In some embodiments, a greater width wt of the conductive pillar 21p can facilitate heat dissipation. In some embodiments, the conductive pillar 21p may provide a greater contact area than the conductive via 21v does to facilitate the welding operation between the semiconductor device package 21 and the substrate 20.

One or more electrical contacts 21b3 (e.g., a solder balls) are disposed on a bottom surface of the substrate 21s. The electrical contact 21b3 can provide an electrical connection between the semiconductor device package 21 and the semiconductor device package 22. For example, the electrical contact 21b3 is electrically connected to the exposed portion of the conductive via 22v of the semiconductor device package 22. As shown in FIG. 2C, the semiconductor device package 21 and the semiconductor device package 22 are spaced apart by the electrical contact 21b3. In some embodiments, an underfill (not shown) may be disposed between the semiconductor device package 21 and the semiconductor device package 22 to cover or encapsulate the electrical contact 21b3.

Referring back to FIGS. 2A, and 2B, the semiconductor device packages 21, 22, 23, and 24 are stacked along the x-axis within the space defined by the case 26. For example, the semiconductor device packages 21, 22, 23, and 24 are stacked on the substrate 20 face-to-face. For example, an active surface of an electronic component (such as the electronic component 21e) of each of the semiconductor device packages 21, 22, 23, and 24 may face the same direction (i.e., along the x-axis). For example, a line normal to a flat active surface of an electronic component (such as the electronic component 21e) of each of the semiconductor device packages 21, 22, 23, and 24 is in a direction along the x-axis. For example, each of the semiconductor device packages 21, 22, 23, and 24 may have a cylindrical shape and stacked on top of each other along the x-axis. In some examples, the semiconductor device packages 21, 22, 23, and 24 may have a same cross-section shape and area, as shown in FIGS. 2A-2C. In some examples, two or more of the semiconductor device packages 21, 22, 23, and 24 may have a same height along the x-axis, as shown in FIGS. 2A-2C. In other examples, two or more of the semiconductor device packages 21, 22, 23, and 24 may have different heights along the x-axis but have the same cross-section shape and area, to accommodate different types of electronic devices.

For example, as shown in FIG. 2B and FIG. 2C, the semiconductor device package 21 has a surface 211, a surface 212 opposite the surface 211, and a lateral surface 213 extending between the surface 211 and the surface 212. The lateral surface 213 faces the substrate 20. The semiconductor device package 22 has a surface 221, a surface 222 opposite the surface 221, and a lateral surface 223 extending between the surface 221 and the surface 222. The lateral surface 223 faces the substrate 20. The surface 221 of the semiconductor device package 22 faces the surface 212 of the semiconductor device package 21. The semiconductor device packages 23 and 24 may be arranged similarly.

Referring to FIG. 2A, the power supply 25 may be spaced apart from the substrate 20. In some embodiments, the power supply 25 may be electrically connected with the substrate 20 through one or more conductive elements, such as a wire. The power supply 25 may include, for example, a DC power supply, an AC-to-DC supply, or other suitable electric power converters. In some embodiments, the power supply 25 may include, for example, a power source such as a battery or a supercapacitor. In some embodiments, the electronic device 2 may include an inductive charging device (such as a wireless charge coil) for charging the power supply 25.

The electronic component 27 may be spaced apart from the substrate 20. In some embodiments, the electronic component 27 may have an electronic component as listed above with respect to the electronic component 21e. The positions and numbers of the electronic components (or the semiconductor device packages) in the electronic device 2 illustrated in the figures are for illustrative purpose only, and are not intended to limit the present disclosure. In some embodiments, there may be any number of electronic components (or semiconductor device packages) arranged in any position in the electronic device 2.

In comparison with the electronic device 1, the semiconductor device packages 21, 22, 23, and 24 in the electronic device 2 are stacked face-to-face along the x-axis, which is the longitudinal direction of the electronic device 2 (of the case 26). In addition, each of the semiconductor device packages 21, 22, 23 and 24 may have a shape that conforms to the space defined by the case 26. For example, a circular shape of each of the semiconductor device packages 21, 22, 23 and 24 conforms to the circular cross section of the space defined by the case 26. Hence, the semiconductor device packages 21, 22, 23, and 24 do not occupy as much volume as the electronic components 11 and 12. In other words, arrangement of the semiconductor device packages 21, 22, 23, and 24 in the electronic device 2 improves space-efficiency. Therefore, more components can be incorporated in the electronic device 2, which means that more functions can be incorporated into the electronic device 2 without increasing the size of the electronic device 2.

In addition, the arrangement of the electronic device 2 provides more flexible transmission paths among the semiconductor device packages 21, 22, 23, and 24. In some embodiments, the signal transmission between the semiconductor device package 21 and semiconductor device package 22 can be achieved through the substrate 20, in a first transmission path, a first interconnection or an indirect transmission path. For example, the first transmission path may include the conductive pillar 21p, one or more interconnection structures (e.g., an RDL) in the substrate 20, and the conductive pillar 22p in the semiconductor device package 22. The transmission between the semiconductor device package 21 and semiconductor device package 23 may include the conductive pillar 21p, one or more interconnection structures (e.g., an RDL) in the substrate 20, and the conductive pillar in the semiconductor device package 23. A similar indirect transmission path between any two of the semiconductor device packages may be achieved through the substrate 20.

In some embodiments in addition or as an alternative to the first transmission path, the signal transmission between the semiconductor device package 21 and semiconductor device package 22 can be achieved through the electrical contact 21b3 and the conductive via 22v, in a second transmission path, a second interconnection, or a direct transmission path. The conductive via 21v may be insulated from the conductive pillar 21p. For example, the conductive via 21v may be electrically disconnected from the conductive pillar 21p. The conductive pillar 21p and the conductive via 21v provide different transmission paths for the semiconductor device package 21 with another semiconductor device package in the stack. The second transmission path is insulated from the substrate 20, given that the conductive via 21v may be insulated from the conductive pillar 21p. In other words, the second transmission path is outside the substrate 20. In some embodiments, the direct transmission path between the semiconductor device package 21 and the semiconductor device package 22 may include second interconnections. The second interconnections comprises the electrical contact 21b3 and the conductive via 22v. The transmission between the semiconductor device package 21 and the semiconductor device package 23 may include conductive via 21v, the conductive via 22v, and a conductive via in the semiconductor device package 23. A similar direct transmission path between any two of the semiconductor device packages may be achieved without passing through the substrate 20.

In some embodiments, the first transmission path (which, for example, includes the conductive pillar 21p and the substrate 20) and the second transmission path (which, for example, includes the conductive via 21v and the electrical contact 21b3) have one or more different electrical properties. For example, the first transmission path and the second transmission path may be different in impedance, resistance, conductivity, and/or dielectric constant.

In some embodiments, data or signal may be transmitted through the direct transmission path, and power may be transmitted through the indirect transmission path. In some embodiments, using the direct transmission path for data transmission can reduce conduction loss in comparison with the electronic device 1 (which has no direct signal transmission path and all transmission paths of the electronic components pass through the substrate 10), which would in turn improve electrical performance and reliability of the electronic device 2.

In some additional or alternative embodiments, data or signal may be transmitted through both the direct transmission paths and the indirect transmission paths which would facilitate data or signal transmission speed of the electronic device 2.

In some embodiments, the direct transmission paths among the semiconductor device packages 21, 22, 23, and 24 may be obtained through coupling. For example, in some embodiments, the semiconductor device package 21 (and each of the other semiconductor device packages 22, 23, and 24), may have an antenna (such as an antenna chip or a patch antenna) or a coupling capacitor disposed on a substrate (such as the substrate 21s in FIG. 2C) thereof. The signals can be transmitted between the semiconductor device packages through the antennas or the capacitors. The semiconductor device packages having antennas with overlapping or the same bandwidths can communicate with each other. Different antennas (such as an antenna for 5G application and an antenna for 4G application) are incorporated in the same semiconductor device package to communicate with one or more semiconductor device packages with different bandwidths or different ranges of frequency. In some embodiments, the antennas may be arranged in a way similar with the conductive vias in the semiconductor device packages.

In some embodiments, the application or usage of the semiconductor structure as shown in FIG. 2B, FIG. 2C, and FIG. 2D are for illustrative purpose only, and are not intended to limit the present disclosure. For example, the semiconductor structure as shown in FIG. 2B, FIG. 2C, and FIG. 2D can be used in any suitable electronic device (e.g., an electronic pen, an electronic watch, an electronic band, electronic glasses or the like).

Figure 2E:
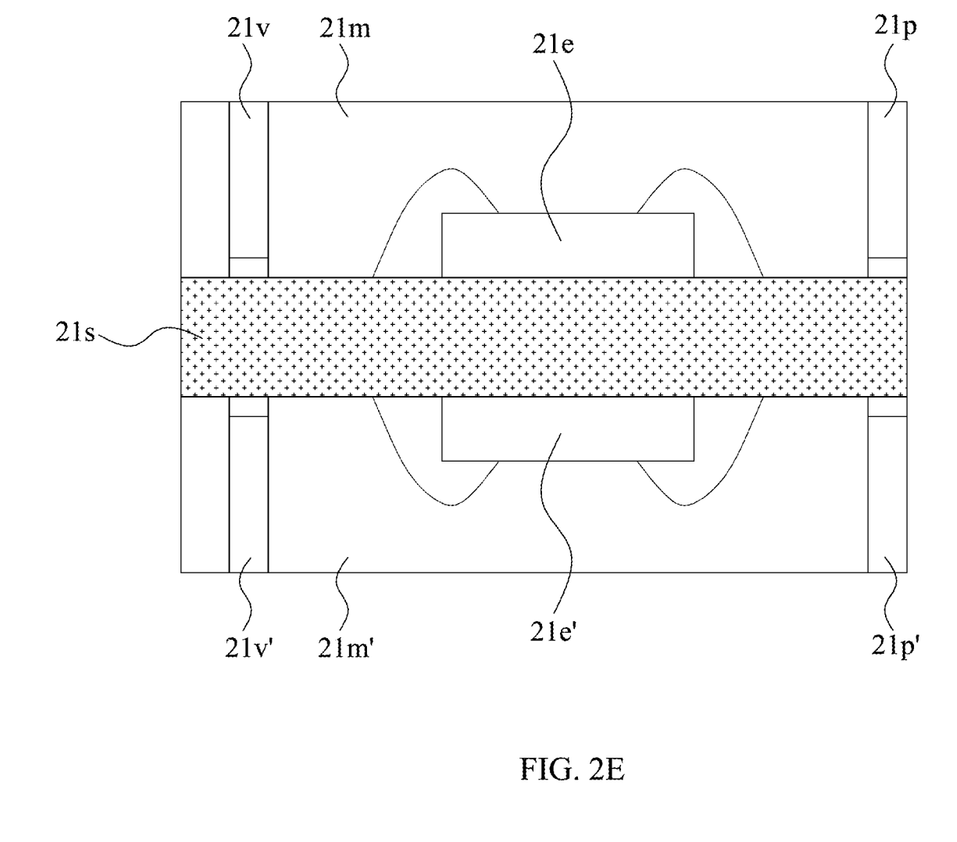
FIG. 2E illustrates a cross-sectional view of an example semiconductor device package in accordance with some embodiments of the present disclosure.
Figure 2F:
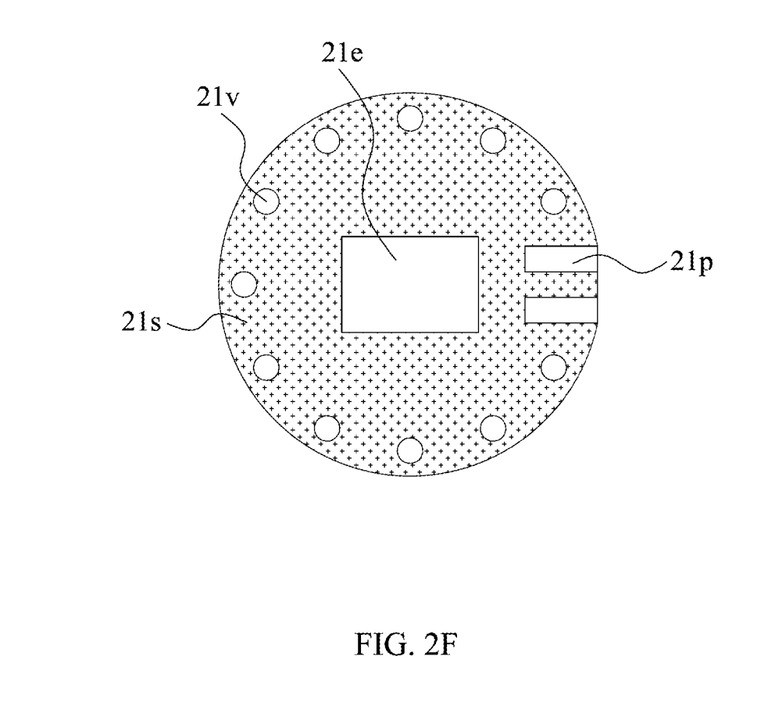
FIG. 2F illustrates a top view of an example semiconductor structure in accordance with some embodiments of the present disclosure.
Figure 2G:
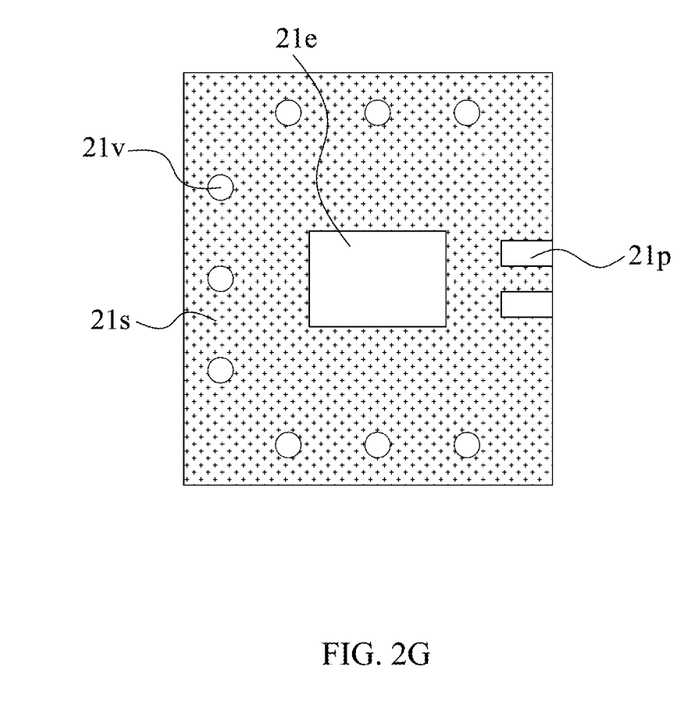
FIG. 2G illustrates a top view of an example semiconductor structure in accordance with some embodiments of the present disclosure.

FIG. 2E illustrates a cross-sectional view of a semiconductor device package in accordance with some embodiments of the present disclosure. In some embodiments, each of the semiconductor device packages 21, 22, 23, and 24 in FIG. 2C may be replaced with the semiconductor device package of FIG. 2E. The semiconductor device package in FIG. 2E is similar to semiconductor device packages 21, 22, 23, and 24 in FIG. 2C, and some of the differences therebetween are described follow.

The semiconductor device package in FIG. 2E is a double-sided semiconductor device package, instead of the single-sided semiconductor device packages 21, 22, 23, and 24. For example, as shown in FIG. 2E, the semiconductor device package further includes an electronic component 21e', a conductive pillar 21p', a conductive via 21v', and a package body 21m' disposed on a bottom surface of the substrate 21s.

In some embodiments, the electronic component 21e' may include a component as listed with respect to the electronic component 21e. In some embodiments, the electronic component 21e' may be different from the electronic component 21e. In some embodiments, the electronic component 21e' may be the same as the electronic component 21e.

The conductive pillar 21p', the conductive via 21v' and the package body 21m' are respectively the same as, similar to, and/or mirror images of the conductive pillar 21p, the conductive via 21v and the package body 21m. The description of the conductive pillar 21p, the conductive via 21v and the package body 21m is likewise applicable to the conductive pillar 21p', the conductive via 21v' and the package body 21m', respectively. In some embodiments, the conductive via 21v' is arranged corresponding to the conductive via 21v. For example, the conductive via 21v' is aligned with the conductive via 21v in a vertical direction.

Figure 3A:
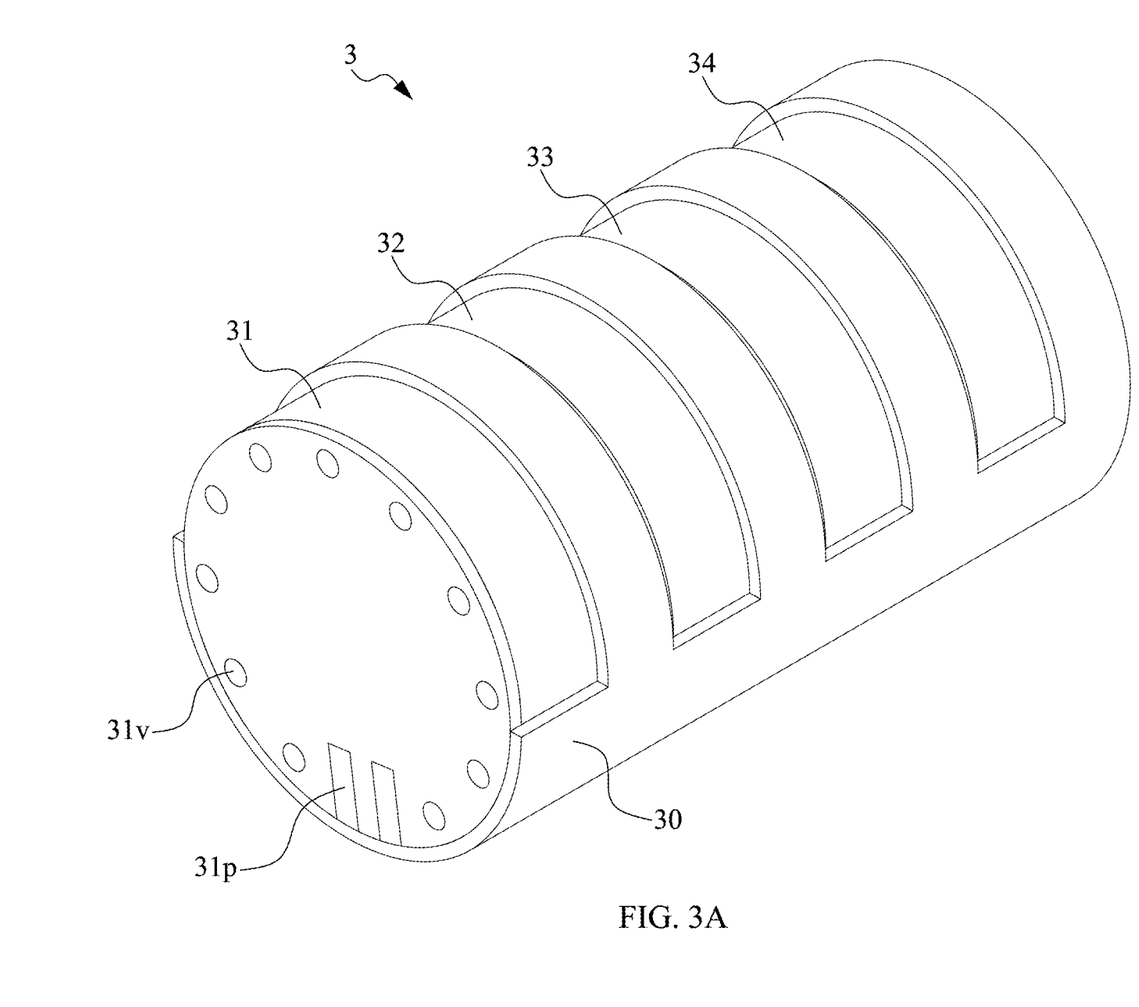
FIG. 3A illustrates a perspective view of an example semiconductor structure in accordance with some embodiments of the present disclosure.
Figure 3B:
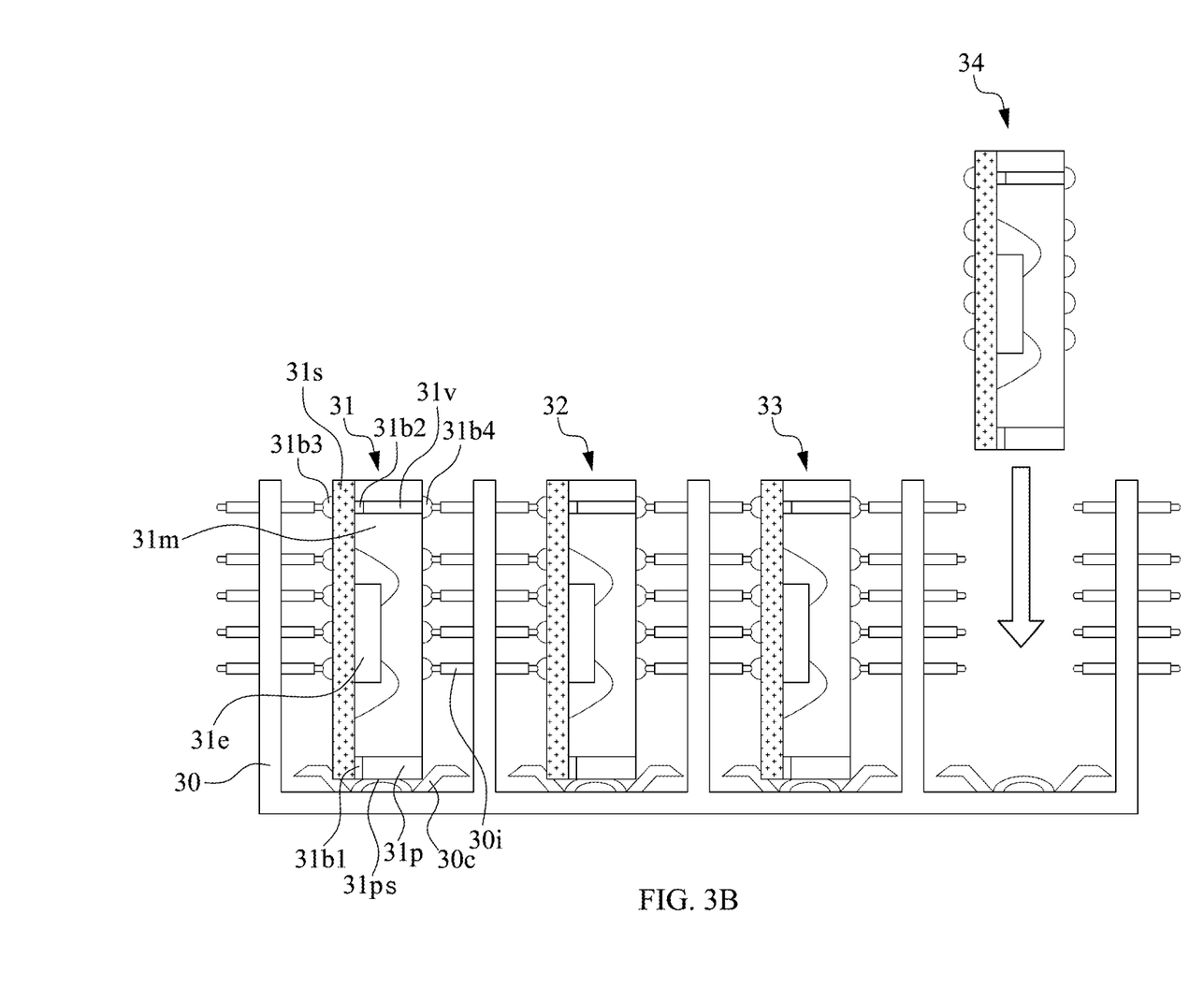
FIG. 3B illustrates a cross-sectional view of the semiconductor structure as shown in FIG. 3A in accordance with some embodiments of the present disclosure.

FIG. 3A is a perspective view of a semiconductor structure 3 in accordance with some embodiments of the present disclosure. FIG. 3B is a cross-sectional view of the semiconductor structure 3 as shown in FIG. 3A.

The semiconductor structure 3 in FIGS. 3A and 3B is similar to the semiconductor structure as shown in FIG. 2B, and the differences therebetween are described below. In some embodiments, the portion denoted by the dashed box A as shown in FIG. 2A may be replaced with the semiconductor structure 3 in FIGS. 3A and 3B.

The semiconductor structure 3 includes a carrier 30. The carrier 30 includes a plurality of sockets for accommodating semiconductor device packages 31, 32, 33, and 34. Each socket of the semiconductor structure 3 includes one or more conductive pins 30i and conductive pads 30c as illustrated in FIG. 3B. The conductive pins 30i are disposed on or adjacent to a sidewall of each socket. The conductive pads 30c are disposed on or adjacent to a bottom surface of each socket. In some embodiments, the carrier 30 may include a substrate and a plurality of connection structures disposed on the substrate. Two of the connection structures and the substrate may define a socket.

The semiconductor device package 31 has a substrate 31s, an electronic component 31e, a conductive pillar 31p, a conductive via 31v, and a package body 31m disposed. The semiconductor device packages 32, 33, and 34 may have the same or similar structure to the semiconductor device package 31. In some embodiments, the semiconductor device packages 31, 32, 33 and 34 may have the same or similar structure to the semiconductor device packages 21, 22, 23 and 24.

A lateral surface 31ps of the conductive pillar 31p is exposed from the package body 31m to provide an electrical connection with the carrier 30. For example, the conducive pillar 31p is electrically connected to the carrier 30 (e.g., to the conductive pad 30c of the carrier 30). In some embodiments, the signal transmission path between the electronic component 31e and the carrier 30 may include the substrate 31s, the electrical contact 31b1, the conductive pillar 31p and the conductive pad 30c.

In some embodiments, the conductive via 31v is electrically connected with the substrate 31s through an electrical contact 31b2 (e.g., a solder ball) disposed on a bottom surface of the conductive via 31v. An electrical contact 31b4 is disposed on a top surface of the conductive via 31v exposed from the package body 31m. The electrical contact 31b4 can provide an electrical connection between the semiconductor device package 31 and the semiconductor device package 32. For example, the conductive via 31v is electrically connected to the carrier 30 (e.g., to the conductive pin 30i of the carrier 30). In some embodiments, the signal transmission path between the electronic component 31e and the carrier 30 may include the substrate 31s, the electrical contact 31b4, and the conductive pin 30i.

Similarly, an electrical contact 31b3 is disposed on a bottom surface of the substrate 31s. The electrical contact 31b3 can provide an electrical connection between the semiconductor device package 31 and the semiconductor device package 32. For example, the conductive via 31v is electrically connected to the carrier 30 (e.g., to the conductive pin 30i of the carrier 30). In some embodiments, the signal transmission path between the electronic component 31*e* and the carrier 30 may include the substrate 31*s*, the electrical contact 31*b*3, and the conductive pin 30*i*.

In some embodiments, each of the semiconductor device packages 31, 32, 33, and 34 may be provided in the sockets of the carrier 30. In some embodiments, using the semiconductor structure 3 in FIG. 3A in an electronic device (such as the electronic device 2 in FIG. 2A), the function of the electronic device can be flexibly adjusted as needed. For example, a user may insert or remove a semiconductor device package with a Bluetooth® function in the socket of the carrier 30 if a Bluetooth® function is needed or unneeded. Similarly, a user may insert or remove a semiconductor device package with a Wi-Fi function in the socket of the carrier 30 if a Wi-Fi function is needed or unneeded.

Figure 4A:
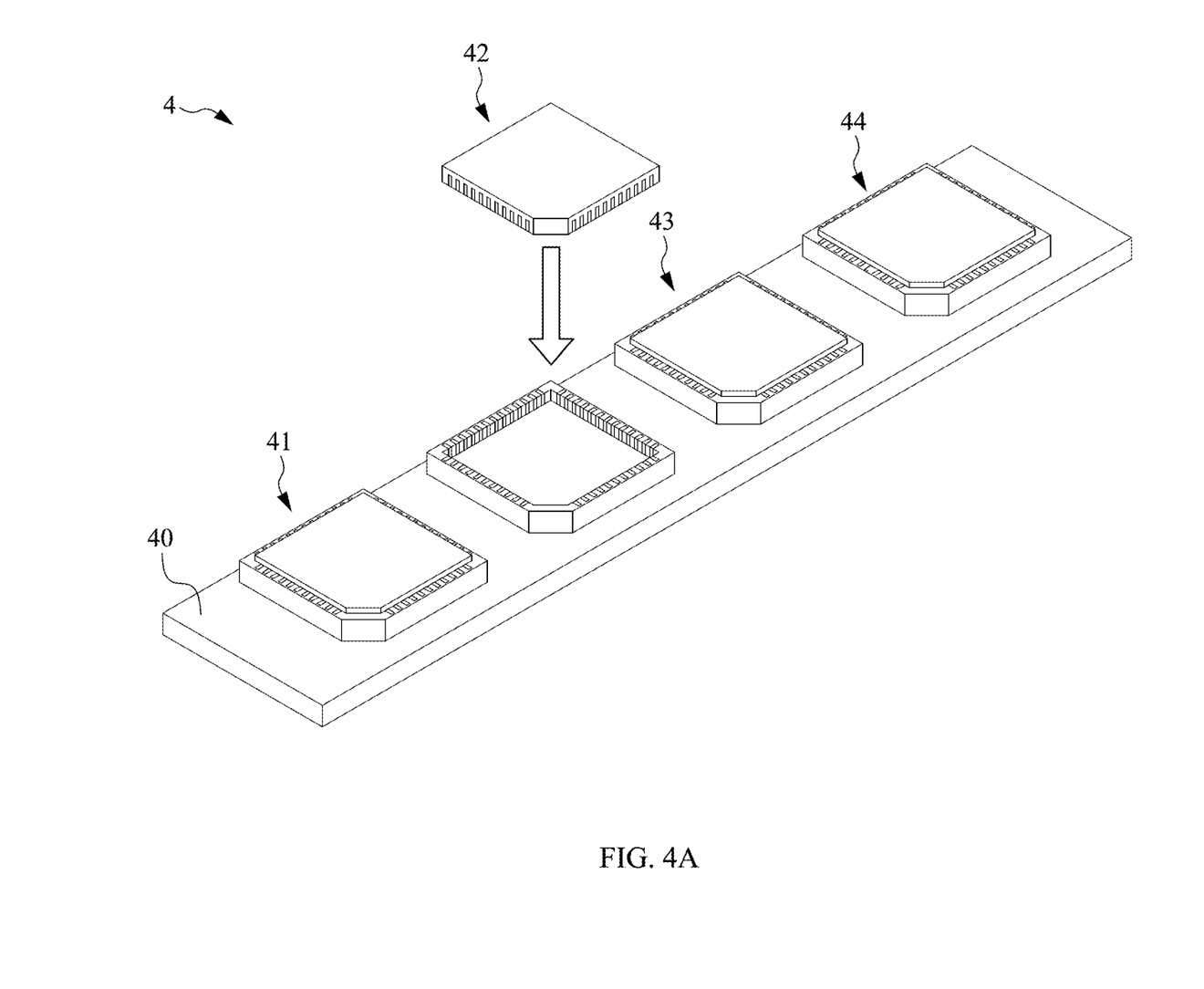
FIG. 4A illustrates a perspective view of an example semiconductor structure in accordance with some embodiments of the present disclosure.
Figure 4B:
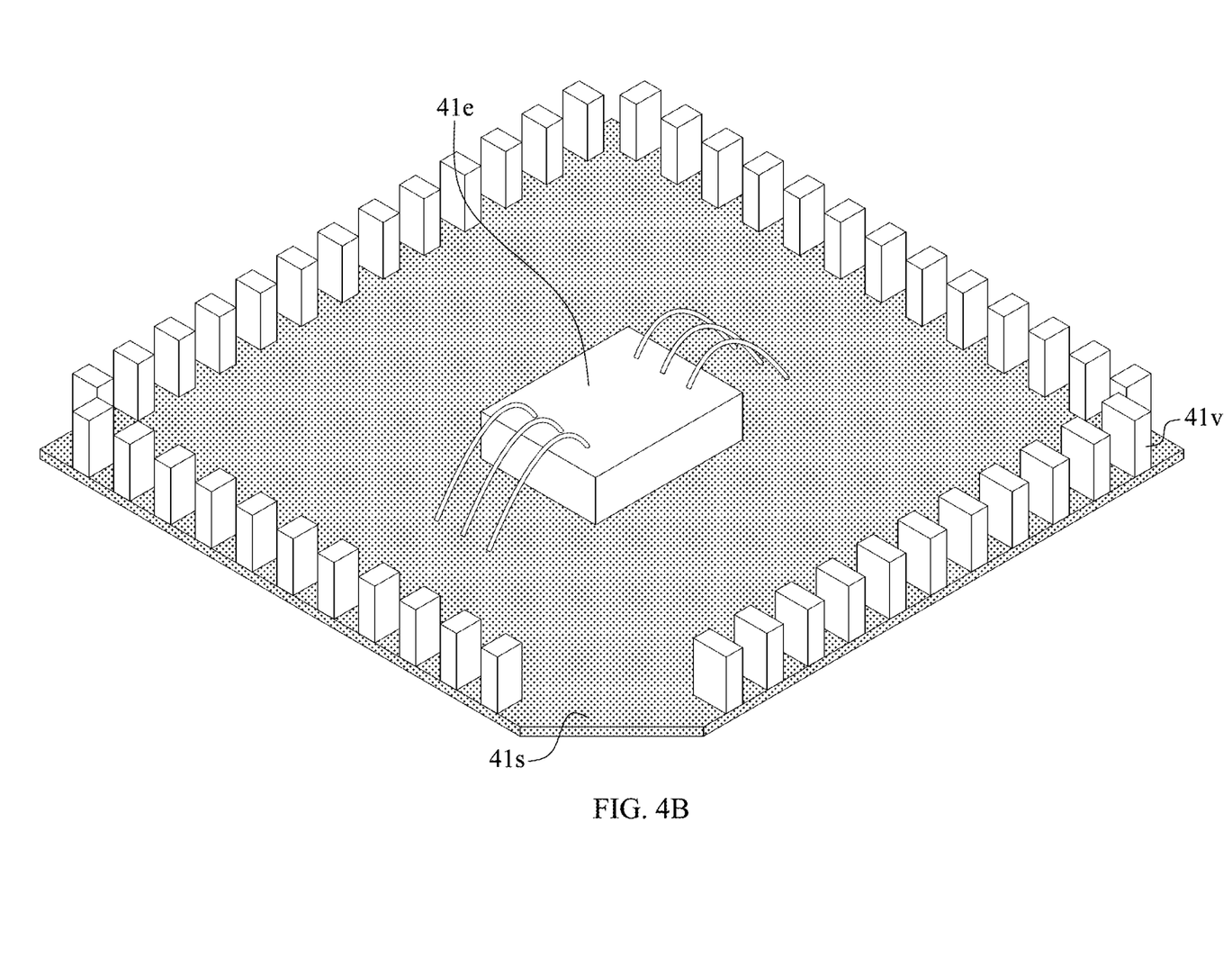
FIG. 4B illustrates a perspective view of a portion of the semiconductor structure as shown in FIG. 4A in accordance with some embodiments of the present disclosure.

FIG. 4A is a perspective view of a semiconductor structure 4 in accordance with some embodiments of the present disclosure and FIG. 4B is a perspective view of a portion of the semiconductor structure 4 of FIG. 4A.

The semiconductor structure 4 in FIGS. 4A and 4B is similar to the semiconductor structure in FIG. 2B, with the differences therebetween as follows. In some embodiments, the portion in the dashed box A as shown in FIG. 2A may be replaced with the semiconductor structure 4 in FIGS. 4A and 4B.

The semiconductor structure 4 includes a carrier 40. The carrier 40 includes a plurality of sockets for accommodating semiconductor device packages 41, 42, 43, and 44. Each socket of the semiconductor structure 4 may include one or more conductive elements for providing signal transmission paths among the semiconductor device packages 41, 42, 43, and 44. The semiconductor device packages 41, 42, 43, and 44 may be arranged side-by-side in the sockets of the carrier 40. For example, a line normal to a flat active surface of each of semiconductor device packages 41, 42, 43, and 44 may extend in the same direction.

As shown in FIG. 4B, the semiconductor device package 41 has a substrate 41*s*, an electronic component 41*e*, a conductive pillar 41*p*, and a package body disposed on the substrate 41*s* to encapsulate the electronic component 41*e*. The semiconductor device package 42, 43, and 44 may have a structure that is the same or similar to that of the semiconductor device package 41.

In some embodiments, the semiconductor device packages 41, 42, 43, and 44 may be electrically connected through conductive pillars (such as the conductive pillar 41*p* of the semiconductor device package 41) and the carrier 40. The conductive pillar 41*p* can provide an electrical connection between the semiconductor device package 41 and the semiconductor device package 42. For example, the conductive pillar 41*p* is electrically connected to the carrier 40. In some embodiments, the signal transmission path between the electronic component 41*e* and the carrier 40 may include the substrate 41*s*, the conductive pillar 41*p*, and the one or more conductive elements in the socket.

In some embodiments, each of the semiconductor device packages 41, 42, 43, and 44 may be provided in the sockets of the carrier 40. In some embodiments, using the semiconductor structure 4 in FIG. 4A in an electronic device (such as the electronic device 2 in FIG. 2A), the function of the electronic device can be flexibly adjusted as needed. For example, a user may insert or remove a semiconductor device package with a Bluetooth® function in the socket of the carrier 40 if a Bluetooth® function is needed or unneeded. Similarly, a user may insert or remove a semiconductor device package with a Wi-Fi function in the socket of the carrier 40 if a Wi-Fi function is needed or unneeded.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor structure, comprising:
   a first substrate having a first surface;
   a first semiconductor device package disposed on the first surface of the first substrate, wherein the first semiconductor device package includes a second substrate, a first conductive element disposed over the second substrate, and a second conductive element disposed over the second substrate;
   a second semiconductor device package disposed on the first surface of the first substrate,
   a first transmission path electrically connecting the first semiconductor device package and second semiconductor device package through the first substrate; and
   a second transmission path electrically connecting the first semiconductor device package and second semiconductor device package, wherein the second transmission path is outside the first substrate;

wherein the first substrate includes a common contact within the first transmission path and the first conductive element of the first semiconductor device package is in contact with the common contact of the first substrate, wherein the second conductive element of the first semiconductor device package is within the second transmission path, and wherein a diameter of the first conductive element of the first semiconductor device package is greater than a diameter of the second conductive element of the first semiconductor device package.

2. The semiconductor structure of claim 1, wherein the first semiconductor device package is stacked on the second semiconductor device package in a direction substantially parallel to the first surface of the first substrate.

3. The semiconductor structure of claim 1, wherein the common contact is electrically connected with a power or is grounded.

4. The semiconductor structure of claim 1, wherein the second transmission path is configured to transmit signal.

5. The semiconductor structure of claim 1, wherein an impedance of the first transmission path is different from an impedance of the second transmission path.

6. The semiconductor structure of claim 3, wherein the second transmission path is configured to transmit signal.

\* \* \* \* \*